United States Patent
Nagana (10) Patent No.: US 8,310,916 B2
(45) Date of Patent: Nov. 13, 2012

(54) DATA TRANSMISSION APPARATUS AND A DATA TRANSMISSION METHOD

(75) Inventor: Tsugumichi Nagana, Tokyo (JP)

(73) Assignee: NEC Corporation, Tokyo (JP)

( * ) Notice: Subject to any disclaimer, the term of this patent is extended or adjusted under 35 U.S.C. 154(b) by 210 days.

(21) Appl. No.: 12/557,126

(22) Filed: Sep. 10, 2009

(65) Prior Publication Data

US 2010/0067370 A1    Mar. 18, 2010

(30) Foreign Application Priority Data

Sep. 12, 2008 (JP) ................................. 2008-234365

(51) Int. Cl.
- G01R 31/08 (2006.01)
- G06F 11/00 (2006.01)
- G08C 15/00 (2006.01)

(52) U.S. Cl. ..................................................... 370/216

(58) Field of Classification Search .................... 370/216
See application file for complete search history.

(56) References Cited

U.S. PATENT DOCUMENTS

| | | | | |
|---|---|---|---|---|
| 4,797,903 A * | 1/1989 | Itoh | ............................... | 375/267 |
| 5,708,684 A * | 1/1998 | Ueda | ............................ | 375/358 |
| 7,162,676 B2 * | 1/2007 | Coleman et al. | ............... | 714/752 |

FOREIGN PATENT DOCUMENTS

| | | |
|---|---|---|
| JP | 8-8886 A | 1/1996 |
| JP | 10-224430 A | 8/1998 |
| JP | 2002290314 A | 10/2002 |

* cited by examiner

*Primary Examiner* — Mark Rinehart
*Assistant Examiner* — Maharishi Khirodhar (57) ABSTRACT

A data transmission apparatus of this invention includes a first transmitting unit, a second transmitting unit, and a switching unit. The first transmitting unit generates a first error correction information, outputs the first data and the first error correction information to the switching unit and transmits a timing information of the first data and a first specified information to specify the first data to the second transmitting unit. The second transmitting unit compares a second specified information to specify the second data and the first specified information and transmitting the a first comparison result of the second specified information and the first specified information to the switching unit. The switching unit transmits the first data and the first error correction information when the first comparison result is not indicating a match of the second specified information and the first specified information.

6 Claims, 8 Drawing Sheets

DATA TRANSMISSION APPARATUS AND A DATA TRANSMISSION METHOD

This application is based upon and claims the benefit of priority from Japanese Patent Application No. 2008-234365, filed on Sep. 12, 2008, the disclosure of which is incorporated herein in its entirety by reference.

TECHNICAL FIELD

The present invention relates to a data transmission apparatus equipped with an error correction coding function and a data transmission method.

BACKGROUND ART

In a data transmission system, by adopting a redundant configuration including an active system and a standby system, the reliability of a data transmission can be improved. For example, a data transmission system equipped with a system switching device, a data transmission apparatus including an active system and a standby system, and a data receiving apparatus, has been in practical use. In such data transmission system, when there are no failures in the active system, the system switching device selects the data of the active system of the data transmission apparatus and transmits the data to the data receiving apparatus. When failures occur in the active system of the data transmission apparatus, the system switching device selects the data of the standby system and transmits the data of the standby system to the data receiving apparatus. In this way, even when failures occur in the active system, a data transmission apparatus equipped with an active system and a standby system provides the continuance of communication. As a result, the reliability of the data transmission improves.

As an example related to the art of a communication system having a redundant configuration in a transmission side, a transmission apparatus is disclosed in Japanese Patent Laid-Open No. H08-008886. The transmission apparatus disclosed in Japanese Patent Laid-Open No. H08-008886 prevents the occurrence of loss of frame of a data receiving apparatus when switching a system by synchronizing the frame of the data between an active system and a standby system of a data transmission apparatus.

Furthermore, in a radio base station having a spread processing section of system and system 1, Japanese Patent Laid-Open No. 2002-290314 discloses a configuration of sending a switching control signal to an output control unit of both systems when failures occur in one system.

Further, Japanese Patent Laid-Open No. H10-224430 discloses a composition of a switching system that inhibits any switching operation of a selector depending on an output of switching information.

SUMMARY

An exemplary object of the invention is to provide a data transmission apparatus and a data transmission method to resolve the problem of the possibility of an occurrence of a serious failure in a receiving apparatus that receives data of added error correction code from the transmission apparatus when the transmission apparatus puts the system switching into effect.

An exemplary aspect of the invention includes a first transmission unit, a second transmission unit, and a switching unit. The first transmission unit generates a first error correction information based on a first data, outputting the first data and the first error correction information to the switching unit and transmitting a timing information of the first data and a first specified information to specify the first data to the second transmission unit. The second transmitting unit generates a second error correction information based on a second data, outputs the second data and the second error correction information to the switching unit, compares a second specified information to specify the second data and the first specified information at the timing of the timing information of the first data indicates and transmits a first comparison result of the second specified information and the first specified information to the switching unit. The switching unit selects and transmits the inputted first specified information and the inputted first error correction information, when the first comparison result is not indicating a match of the second specified information and the first specified information.

An exemplary aspect of the invention includes the steps of generating a first error correction information based on a first data, outputting the first data and the first error correction information to a switching unit, transmitting a timing information of the first data and a first specified information to specify the first data to the second transmission unit, generating a second error correction information based on a second data, outputting the second data and the second error correction information to the switching unit, comparing a second specified information to specify the second data and the first specified information at the timing of the timing information of the first data indicates, transmitting the a first comparison result of the second specified information and the first specified information to the switching unit and selecting and transmitting the inputted first specified information and the inputted first error correction information, when the first comparison result is not indicating a match of the second specified information and the first specified information.

An exemplary aspect of the invention includes a first transmission unit for generating a first error correction information based on a first data and for outputting the first data and the first error correction information to a switching unit transmitting a timing information of the first data and a first specified information to specify the first data to the second transmission unit, includes a second transmission unit for generating a second error correction information based on a second data, for outputting the second data and the second error correction information to the switching unit, for comparing a second specified information to specify the second data and the first specified information at the timing of a timing information of the first data indicates and for transmitting the a first comparison result of the second specified information and the first specified information to the switching unit, and includes the switching unit for selecting and transmitting the inputted first specified information and the inputted first error correction information when the first comparison result is not indicating a match of the second specified information and the first specified information.

BRIEF DESCRIPTION OF THE DRAWINGS

Exemplary features and advantages of the present invention will become apparent from the following detailed description when taken with the accompanying drawings in which.

EXEMPLARY EMBODIMENT

Next, a detailed explanation will be given for a first exemplary embodiment with reference to the drawings.

1. First Exemplary Embodiment

Figure 1:
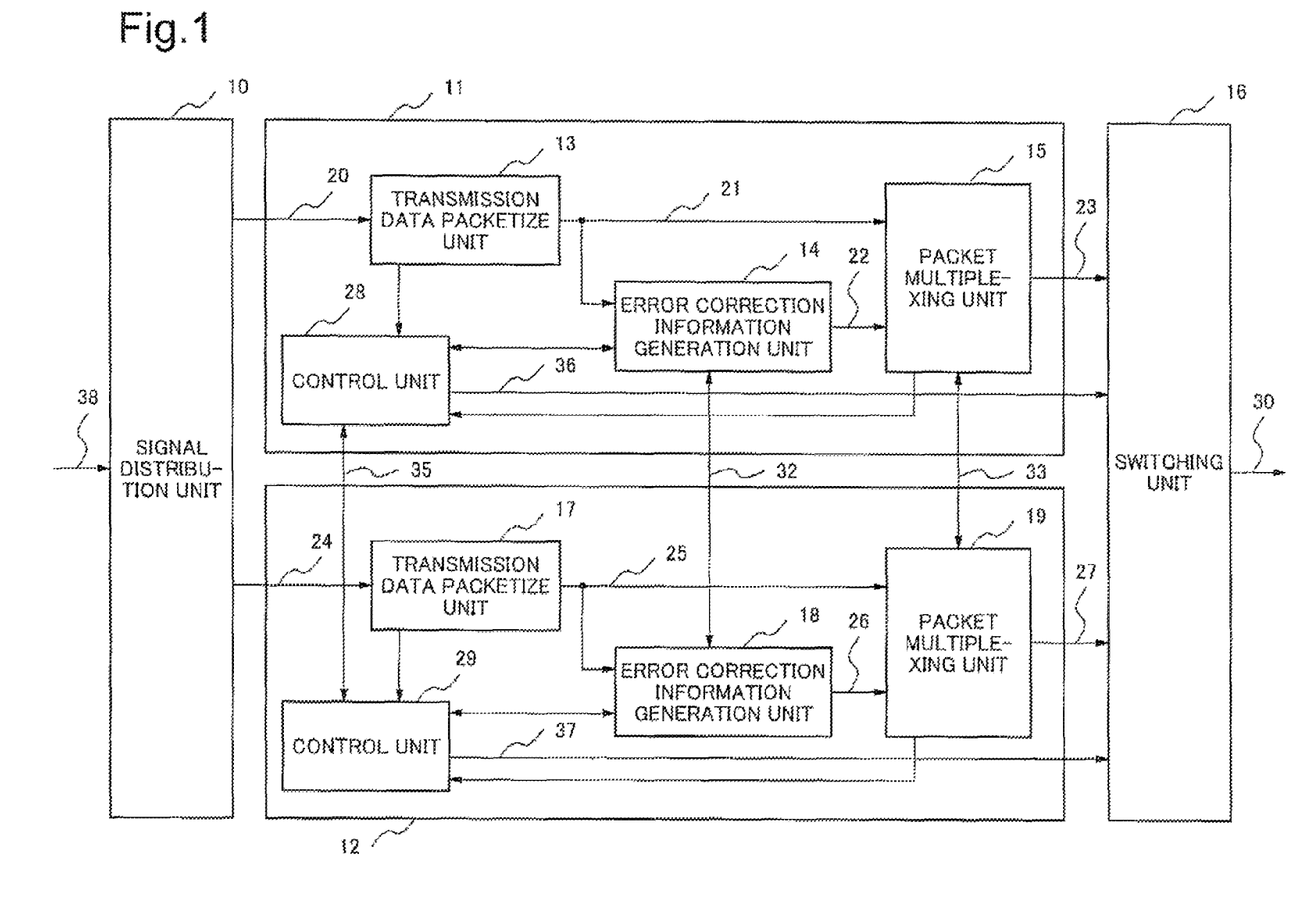
FIG. 1 is a diagram showing a first embodiment of a data transmission apparatus of the present invention.

FIG. 1 shows a first embodiment of a data transmission apparatus of the present invention. In the first embodiment, the data transmission apparatus includes a signal distribution unit 10, an active transmitting unit 11, a standby transmitting unit 12 and a switching unit 16.

The signal distribution unit 10 distributes an input data 38 as transmission data 20 and 24, to the active transmitting unit 11 and to the standby transmitting unit 12 at the same time.

The active transmitting unit 11 and the standby transmitting unit 12 have the same configuration. The active transmitting unit 11 and the standby transmitting unit 12 generate correction block which is a unit block of an error correction coding process, by performing the error correction coding process by packetizing an inputted transmission data. In order to perform the above stated functions, the active system transmitting unit 11 and the standby system transmitting unit 12 each includes transmission data packetizing units 13 and 17, error correction information generating units 14 and 18, packet multiplexing units 15 and 19, and control units 28 and 29.

The operation of the first embodiment shown in FIG. 1 will be described. The transmission data packetizing unit 13 packetizes inputted transmission data 20. Then, transmission packetizing unit 13 transmits packetized transmission data 21 to packet multiplexing unit 15. In parallel, the error correction information generating unit 14 generates an error correction information 22 from the packetized transmission data 21 and transmits the error correction information 22 to the packet multiplexing unit 15. The packet multiplexing unit 15 generates a correction block which puts the transmission data 21 and the error correction information 22 in sequence, and transmits them as a multiplexed transmission data 23 to switching unit 16. The alignment of data, information and the like in sequence, hereinafter referred to as multiplexing.

Further, the control unit 28 holds the information on the state of failure of the active transmitting unit 11.

The above is a description related to an operation of the active transmitting unit 1. Since an operation of the standby transmitting unit 12 is carried out in a similar manner, the description of the operation of the standby transmitting unit 12 corresponding to the above is omitted.

Further, when the switching unit 16 selects data of the active transmitting unit 11 and is outputting the data to the line 30, the error correction information generation unit 14 is transmitting an error correction processing information synchronization signal 32 to the error correction information generation unit 18. The error correction processing information synchronization signal 32 includes necessary information for synchronizing error correction coding process and the timing of starting error correction coding. The state that error correction coding process is synchronizing means the state of the error correction information generation unit 14 and the error correction information generation unit 18 are generating error correction information at the same time by the same transmission data. The information which is necessary for the synchronization of the error correction coding process is, for example, timing information which indicates the head of a packet (hereinafter, referred to as head packet timing information) which is the target packet (hereinafter, referred to as correction target packet) of generating an error correction information, and a packet number of the head of the correction target packet (hereinafter, referred to as head packet number).

Furthermore, when the switching unit 16 selects data of the active transmitting unit 11 and outputting the data to the line 30, the packet multiplexing unit 15 transmits a multiplexing synchronization signal 33 to the packet multiplexing unit 19. The multiplexing synchronization signal 33 includes necessary information on the synchronization of the multiplexing process. The state of the multiplexing process synchronizing means the state of the packet multiplexing unit 15 and the packet multiplexing unit 19 outputting the same multiplexed data to the switching unit 16 at the same time. The necessary information for the multiplexing synchronization includes the information on the timing of the generation of the correction block of the packet multiplexing unit 15 and the information on which packet and what number of the transmission data or the error correction information the packet multiplexing unit 15 is outputting respectively on a time axis.

When the switching unit 16 selects the output data of the active transmitting unit 11 and is outputting the output data to the line 30, the control unit 29 holds the information on the state of the synchronization at the generation of the correction block between the active transmitting unit 11 and the standby transmitting unit 12. Then, when switching unit 16 selects output of standby transmitting unit 12 and is outputting the output of the standby transmitting unit 12 to the line 30, the control unit 28 holds the information on the state of synchronization with standby transmitting unit 12.

Further, between the control unit 28 and 29, the information which each control units holds can be transferred mutually using control signal 35. Furthermore, the control units 28 and 29 are outputting switching signals 36 and 37 to switching unit 16.

The switching unit 16 receives the multiplexed data signals 23 and 27. Further, the switching unit 16 receives the switching signals 36 and 37. The switching unit 16 selects the multiplexed data signal 23 or 27 and outputs the selected data to the line 30, according to the switching signals 36 and 37.

Figure 2:
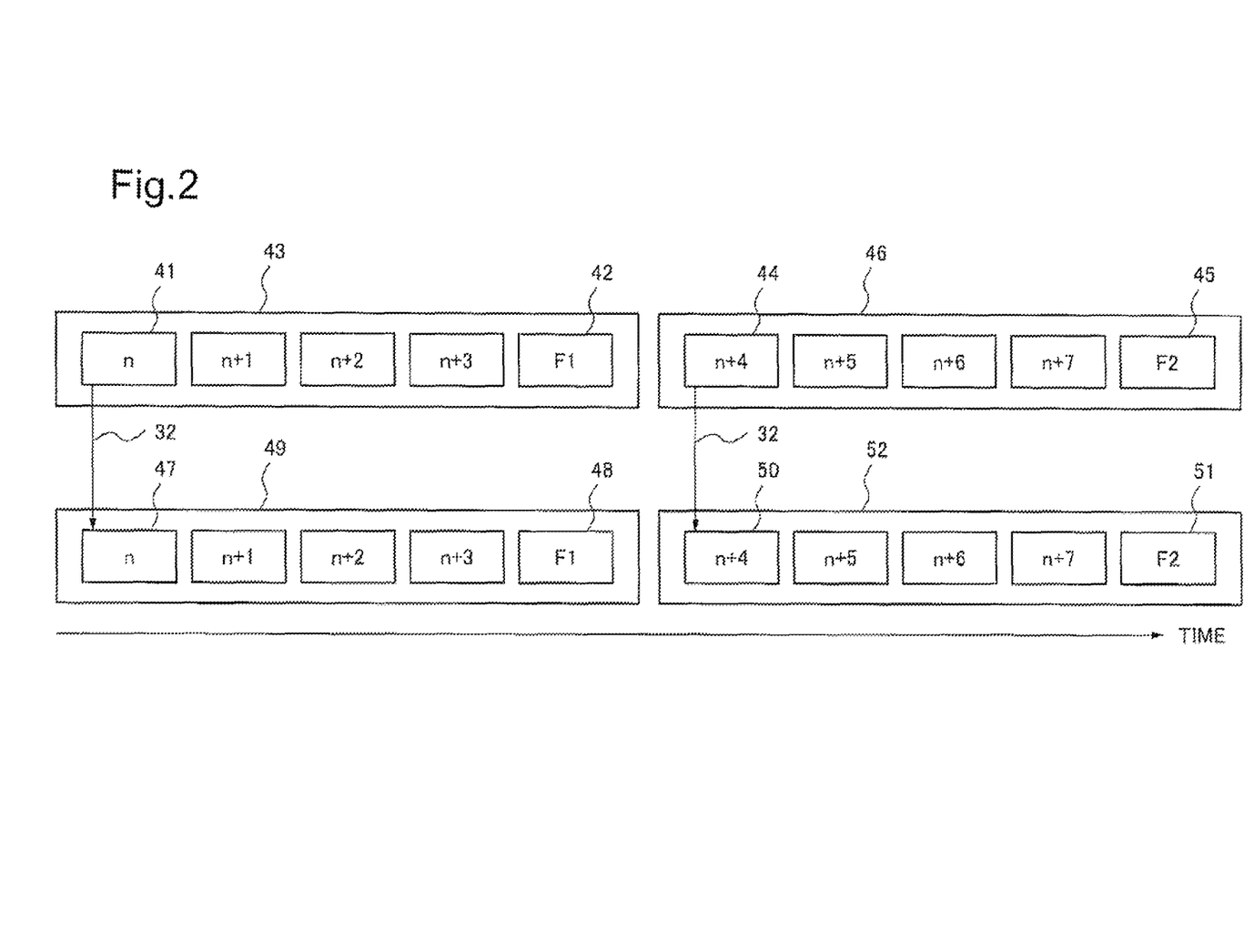
FIG. 2 is a diagram showing a phase relation between correction blocks in the first embodiment of the data transmission apparatus of the present invention.

FIG. 2 is an exemplary diagram showing a phase relation between the correction blocks 43, 46, 49, and 52 in the first embodiment of the present invention. By referring to FIG. 1 and FIG. 2, a generation procedure and a synchronization confirmation method of the correction block of this embodiment will be described.

The transmission data packetize unit 13 transmits the packetized transmission data 21 to the packet multiplexing unit 15.

The packetized transmission data 21 is a data packet 41 wherein the packet number is n, and is a packet following the packet thereof in FIG. 2.

In FIG. 1, the error correction information generation unit 14 makes four packets from data packet 41 whose packet number is n, to the packet whose packet number is n+3 as a target of the error correction coding process. That is, these four packets are the correction target packet.

The error correction information generation unit 14 generates an error correction information 42 (F1) from the data packets included in the correction target packet. The error correction information generating unit 14 transmits the generated error correction information 42 (F1) to the packet multiplexing unit 15.

The packet multiplexing unit 15 generates the correction block 43 by multiplexing four packets received from the transmission data packetize unit 13 which are the packets from the data packet 41 whose packet number is n to the packet whose packet number is n+3, and the error correction information 42 received from the error correction information generation unit 14, on the time axis. In this way, the packet multiplexing unit 15 periodically generates the correction block 43 which is a unit block of the error correction process and is outputting the correction block 43 to the switching unit 16 as the multiplexing transmission data 23.

The error correction information generation unit 14 transfers head packet timing information and the head packet number by using the error correction processing synchronization signal 32 to the error correction information generation unit 18 of standby transmitting unit 12. The head packet timing information is the information of the timing of the head packet of the correction target packet. Further, the head packet number is the packet number of the packet at the head of the correction target packet, and the packet number n of the data packet 41 will be the head packet number as of the generation of the correction block 43.

The error correction information generation unit 18 makes the inputted four packets from data packet 47 whose packet number is n, to packet whose packet number is n+3, as the correction target packet. Furthermore, the error correction information generation unit 18 generates error correction information 48 (F1) from the correction target packet. The error correction information generating unit 18 transmits the generated error correction information 48 (F1) to the packet multiplexing unit 19.

The packet multiplexing unit 19 generates the correction block by multiplexing four packets from data packet 47 (packet number n) to packet number n+3, and error correction information 48 on the time axis.

The above is the generation procedure of the correction block 43 and 49, which makes the packets from packet number n to packet number n+3 as the correction target packet.

Correction blocks 46 and 52, for correcting the packet from packet number n+4 to packet number n+7 are generated similarly as follows.

The error correction information generation unit 14 makes four packets from packetized data packet 44 (packet number is n+4) to packet number n+7 as the correction target packet in the next correction block 46. Then, error correction information generation unit 14 generates error correction information 45 (F2) and transmits the error correction information 45 to packet multiplexing unit 15.

The packet multiplexing unit 15 generates correction block 46 by multiplexing the four packets, from the packetized data packet 44 (packet number is n+4) to packet number (n+7), and the error correction information 45 (F2) on the time axis.

The error correction information generation unit 18 newly receives head packet timing information and head packet number (n+4) from the error correction information generating unit 14. Then, the four packets from a data packet 50 (packet number is n+4) to packet number n+7 are set as the correction target packet in the next correction block 52.

The error correction information generating unit 18 generates error correction information 51 (F2).

The packet multiplexing unit 19 generates correction block 52 by multiplexing the four packets, from data packet 50 (packet number is n+4) to packet number n+7, and the error correction information 51 on the time axis.

As in the descriptions given above, the generation of the synchronized error correction information in the active transmitting unit 11 and the standby transmitting unit 12 is repeated by the cycle of the correction block.

A method to confirm the state of synchronization of the correction target packets 43 and 49 in the standby transmitting unit 12 will be described below.

The error correction information generation unit 18 receives the head packet timing information and the head packet number n from the error correction information generation unit 14. The error correction information generation unit 18 learns the timing when the correction target packet is inputted to the error correction information generation unit 14 by the head packet timing information. The timing when the correction target packet is inputted is, for example, the timing when the error correction information generation unit 14 receives the head of the correction target packet.

The error correction information generating unit 18 compares the packet number of a packetized transmission data 25 in timing indicated by the head packet timing information, with the packet number indicated by the correction block head packet number.

As a procedure of comparing the packet numbers, for example, there is a method of comparing the packet number of a packet which is inputted in the error correction information generation unit 18 and extracted at the timing indicated by the head packet timing information, with the head packet number. Alternatively, there is a method of comparing the head packet number with the packet number of a packet newly arriving to the error correction information generation unit 18 after the timing indicated by the head packet timing information.

Then, the error correction information generating unit 18 regards the generation of error correction information as being synchronized between the active transmitting unit 11 and the standby transmitting unit 12 when the compared packet numbers are the same.

If the packets being processed at the same timing in the error correction information generation unit 14 and the error correction information generation unit 18 differ, the contents of the correction block of the packet multiplexing unit 15 and of the packet multiplexing unit 19 generating at die same time will also differ. If the switching unit 30 performs switching in such situation, the normality of the correction block that the receiving apparatus receives will be lost, and after the switching, the receiving apparatus receives improper correction block wherein the contents are not continuous. Then, there is a risk that the receiving apparatus will perform a wrong correction when receiving the improper correction block.

Accordingly, the error correction information generation unit 18 regards the synchronization as being improper when the packet number of inputted data signal 47 differs from n.

The error correction information generation unit 18 notifies the control unit 29 the status of the synchronization of the error correction code detected at the error correction information generation unit 18. Further, the transmission data packetize unit 17 notifies the control unit 29 the status of the synchronization of the packetized transmission data. The control unit 29 transfers the status of the synchronization of the transmission data packetize unit 17 and the error correction information generating unit 18 to the control unit 28 by the control signal 35.

In addition, the control unit 29 notifies the switching unit 16 of the synchronization state of the error correction information generating unit 18 by using the switching control signal 37. As a result, switching unit 16 can know the synchronization state of the error correction information of the standby transmitting unit 12 and the error correction information of the active transmitting unit 11. Then, when the synchronization state is improper, the switching unit 16 inhibits the switching to standby transmitting unit 12. As a result, the switching from the active transmitting unit 11 to the standby transmitting unit 16 in the improper synchronized state can be prevented.

As mentioned above, by confirming the synchronization state of the generation of the correction block between the active transmitting unit 11 and the standby transmitting unit 12, it is possible to prevent the receiving apparatus from performing an improper correction when the synchronization is improper.

Furthermore, each of the transmission data packetize unit 13, the error correction information generating unit 14, and the packet multiplexing unit 15 notifies failure information to the control unit 28. The failure information includes the information indicating which part of the active transmitting unit 11 is at failure or not. In this way, the control unit 28 gathers and holds the information on whether the failure is occurring in active transmitting unit 11.

The control unit 28 transfers the failure state of the active transmitting unit 11 to the error correction information generating unit 18 via the control unit 29. Moreover, the control unit 28 may transfers the failure state to the error correction information generating unit 18 via the error correction information generation unit 14.

The information on the failure status of the active transmitting unit 11 is transferred to the error correction information generation unit 18. When the information on the failure status includes the failure state of the active unit 11, the error correction information generating unit 18 assumes an improper synchronization occurred with the active transmission unit 11 is at failure. Then, the error correction information generating unit 18 suspends the synchronization of the error correction of the active transmitting unit 11 in the standby transmitting unit 12. In such case, the standby transmitting unit 12 continues the error correction coding process using the error correction information which has been generated by synchronizing with active transmitting unit 11 until the active transmitting unit 11 fails. As a result, the standby transmitting unit can continue the generation of the correction block even after the failure of the active transmitting unit 11.

When one of the notified failure information by the transmission data packetize unit 13, the error correction information generating unit 14, and the packet multiplexing unit 15 includes the information which indicates the failure state, the active transmitting unit 11 is at failure state. On this occasion, the control unit 28 notifies the switching unit 16 that the active transmitting unit 11 is in the failure state by switching signal 36.

By receiving a notification of the active transmitting unit 11 being in a failure state, the switching unit 16 performs switching when switching signal 37 from the standby transmitting unit 12 is indicating that it can select multiplexed transmission data 27 of the standby transmitting unit 12. Then, the switching unit outputs the multiplexed transmission data 27 of the standby transmitting unit 12 to the line 30. When the switching signal 37 from the standby transmitting unit 12 is notifying that it is impossible for the multiplexed transmission data 27 of the standby transmitting unit 12 to be selected due to the failure of the standby transmitting unit 12 or the like, the switching unit 16 will not perform the switching.

If the failure of the active transmission unit 11 is restored after switching to the standby transmitting unit 12, the active transmitting unit 11 and the standby transmitting unit 12 operates as the active transmitting unit 11 and the standby transmitting unit 12 being replaced in the above mentioned description. In other words, the standby transmitting unit 12 transmits the error correction process synchronization signal 32 and the multiplexed synchronization signal 33 to the active transmitting unit 11. Then, the active transmitting unit 11 generates multiplexed transmission data 23 whose transmission timing from the packet multiplexing unit 15 synchronizes with the multiplexing transmission data 27. Further, the control unit 28 notifies the switching unit 16 of the synchronization state of the error correction information generation unit 18, by the switching control signal 36. The failure of the standby transmitting unit 12 may trigger the switching from the standby transmitting unit 12 to the active transmitting unit 11. Alternatively, the system transmitting data can be forcibly switched from the standby transmitting unit 12 to the active transmitting unit 11 by using the switching signals 36 and 37 after the active transmitting unit 11 has been restored.

An example of a procedure that forcibly switches the system transmitting data from the standby transmitting unit 12 to the active transmitting unit 11 will be described below. At first, the information that the transmission data 23 of the active transmission unit 11 is selectable is notified to the switching unit 16 by switching signal 36. Next, regardless of the state of the standby transmitting unit 12, the control unit 29 notifies the switching unit 16 of the standby transmitting unit 11 being in the failure state by using switching signal 37. Then, the switching unit 16 selects the transmission data 23 that is transmitted from the active transmitting unit 11 and outputs the transmission data 23 to the line 30. As a result, transmission unit for the transmitting data can forcibly switched to the active transmitting unit 11 from the standby transmitting unit 12.

Further, if the correction process method generates the correction block by generation of the error correction information, by transferring necessary information of the synchronization from the active transmitting unit 11 to the standby transmitting unit 12, an effect of having the correction block be synchronized can be obtained as described above. The generation of the correction block can be synchronized by forwarding the timing of the generation of the correction block or the information on designating the packet composing the correction block, even when the data transmission apparatus differs from the first embodiment regarding the size or the content of the correction block.

As described above, in the first embodiment of the present invention, there is an effect of preventing the receiving apparatus from performing the wrong correction before and after switching from the active transmitting unit to the standby transmitting unit.

The reason is that the confirmation of the synchronization between the packets of the active transmitting unit 11 and the standby transmitting unit 12 is performed when generating the error correction information. Further, the continuance of the correction block is kept before and after the switching from the active transmitting unit 11 to the standby transmitting unit 12. This is the result of the switching to the standby transmitting unit 12 performed when the correction block generation process of the standby transmitting unit 12 synchronizes with that of the active transmitting unit 11 is.

2. Second Exemplary Embodiment

Next, a detailed explanation will be given for a second exemplary embodiment of the present invention with reference to FIG. 3 to FIG. 6.

Figure 3:
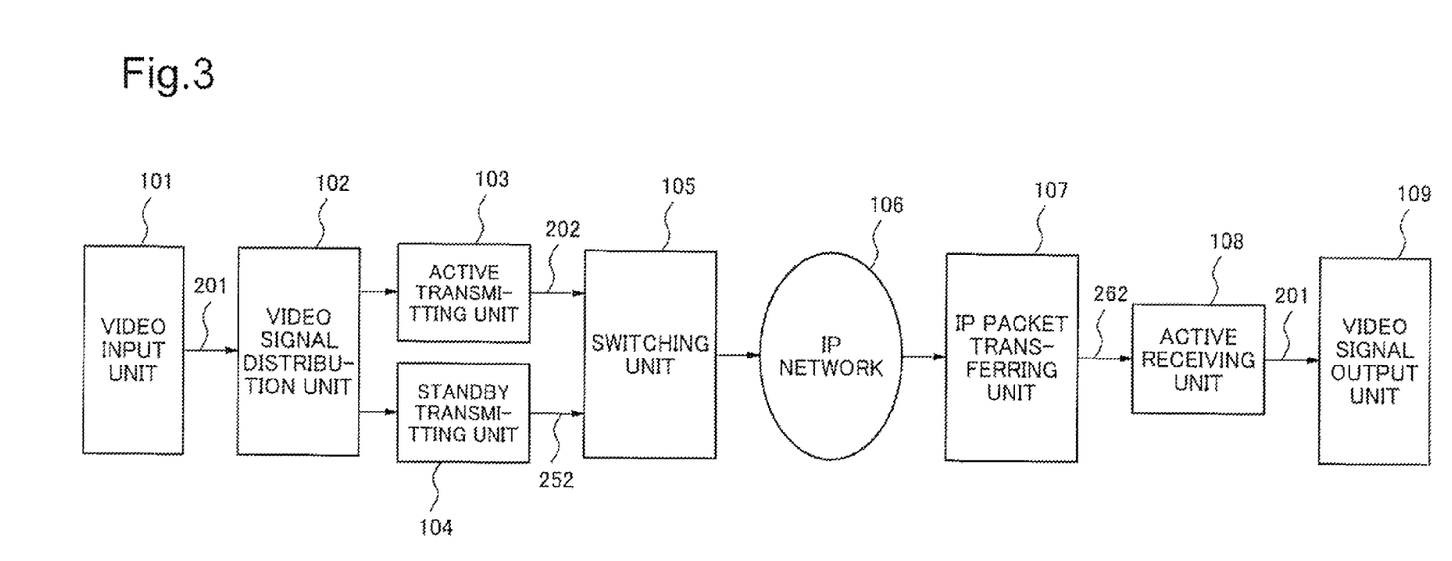
FIG. 3 is a diagram showing a second embodiment of a data transmission apparatus of the present invention.

FIG. 3 is a diagram showing a data transmission apparatus in the second embodiment of the present invention. The second embodiment applies the present invention to a video transmission system using an IP (Internet Protocol) network. The video transmission system shown in FIG. 3 distributes a video signal 201 inputted from a video input unit 101, to an active transmission unit 103 and a standby transmission unit 104 by using a video signal distribution unit 102.

The video signal 201 may be not only an incompressible video signal of a HDTV (High Definition Television) and a SDTV (Standard Definition Television) signal, but also a TS (Transport Stream) video signal of compressed video signal.

The active transmitting unit 103 and the standby transmitting unit 104 transmit the video signal or an error correction packet as IP packets 202 and 252 to a switching unit 105. The IP packets 202 and 252 are stored in an "Ethernet" (registered trademark) frame. The switching unit 105 selects either the IP packet 202 received from the active transmitting unit 103 or the IP packet 252 received from the standby transmitting unit 104 and transmits either the IP packet 202 or the IP packet 252 to an IP network 106.

An IP packet transferring unit 107 receives an IP packet 262 from the IP network 106 and transfers the IP packet to an active receiving unit 108. The active receiving unit 108 regenerates the video signal 201 from the IP packet 262 and transmits to video signal output unit 109.

Figure 4:
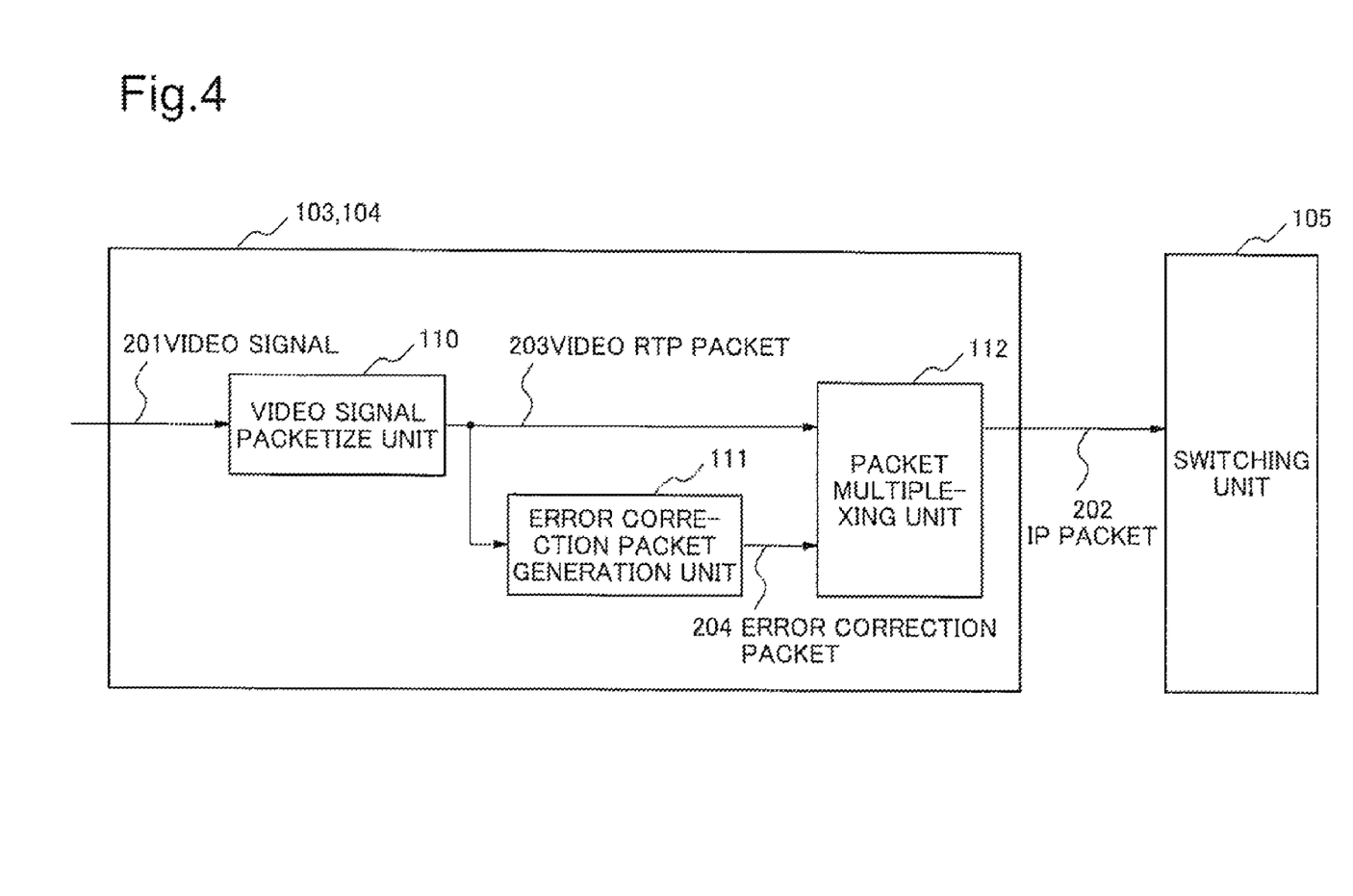
FIG. 4 is an explanatory diagram of an operation of packetizing in an active transmission unit and a standby transmission unit in the second embodiment of the transmission apparatus of the present invention.

FIG. 4 is a diagram explaining a packetize operation of the active transmitting unit 103 and the standby transmitting unit 104 in the second embodiment. In FIG. 4, the packetize operation is common in the active transmitting unit 103 and the standby transmitting unit 104, therefore the active transmitting unit 103 will be described below.

A video signal packetize unit 110 packetizes the video signal 201 inputted from the image signal distribution unit 102, to video RTP (Real-time Transport Protocol) packet 203.

Further, an error correction packet generation unit 111 generates error correction packet 204 based on the video RTP packet 203.

Further, the video signal packetize unit 110 and the error correction packet generation unit 111 each packetizes the video RTP packet 203 and the error correction packet 204 under the protocol that processes UDP (User Datagram Protocol), IP packet and Ethernet frame. A packet multiplexing unit 112 multiplexes the video RTP packet 203 and the error correction packet 204 and transmits these packets to the switching unit 105 as IP packet 202

Figure 5:
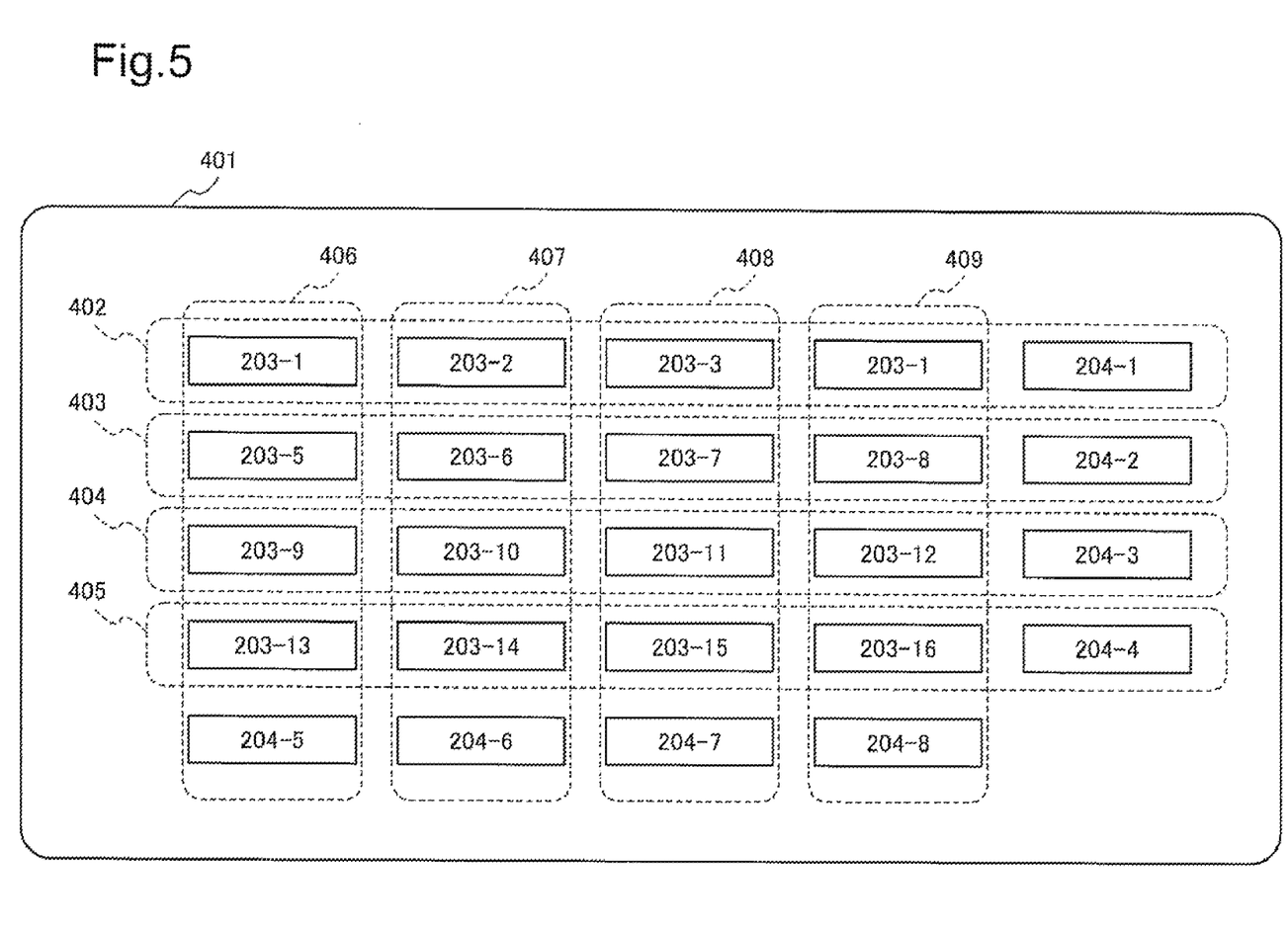
FIG. 5 is a diagram showing an error correction process and a generation procedure of an error correction packet in the second embodiment of the transmission apparatus of the present invention.

FIG. 5 is a diagram showing a generation of an error correction process and an error correction packet in the second embodiment. Referring to FIG. 5, the generation of the error correction packet of the active transmitting unit 103 and the standby transmitting unit 104 will be explained.

In FIG. 5, a correction block 401 includes video RTP packets 203-1 through 203-16 and error correction packets 204-1 through 204-8.

In the video RTP packets 203-1 through 203-16, the subscript "M" of 203-M (M=1,2, . . . , 16) indicates the order of transmission of the video RTP packet. Further, in the error correction packets 204-1 through 204-8, the subscript "N" of 204-N (N=1,2, . . . , 8) indicates the order of the generation of the error correction packet added to the video RTP packets 203-1 through 203-16 which are the unit of the error correction.

Maximum values of the subscripts "M" and "N" are each 16 and 8 in the second embodiment shown in FIG. 5. However, the size of correction block 401 is determined by the setting of a video transmission system. Therefore, maximums of die subscripts "M" and "N" may differ in each video transmission system.

The generation process of the error correction packet of video RTP packets 203-1 through 203-16 will be explained in the following (1) through (8).

(1) The error correction packet generating unit 111 generates the error correction packet 204-1 by performing the following XOR (exclusive OR) operation to video RTP packets 203-1 through 203-4. First, XOR operation for each bit is performed to RTP packet 203-1 and RTP packet 203-2, and as a result to the operation thereof, obtains bit string X1. Next, XOR operation for each bit is performed to bit string X1 and RTP packet 203-3, and as a result to the operation thereof, obtains bit string X2. Finally, XOR operation for each bit is performed to bit string X2 and RTP packet 203-4, and as a result to the operation thereof, obtains error correction packet 204-1.

The unit of above generation is made as an operational row 402. An operational row is a row that is composed of the video RTP packet and the error correction packet that is generated from thereof.

The error correction packet 204-1 includes the information which indicates the video RTP packet 203-1 is the head of the unit of process (hereinafter, referred to as head packet information), and the information on the video RTP packet which is the target of generation of the error correction packet 204-1 (hereinafter, referred to as correction target packet information). In other words, the head packet information indicates the video RTP packet 203-1 in error correction packet 204-1, and the correction target packet information indicates the range of the correction target packet is the video RTP packets 203-1 through 203-4.

(2) The error correction packet generating unit 111 generates the error correction packet 204-2 by performing XOR operation to video RTP packets 203-5 through 203-8 by the same procedure as the description in (1). The unit of the generation is made operational row 403. In other words, the head packet information indicates video RTP packet 203-5, and the correction target information indicates the range of the correction target packet is the video RTP packets 203-5 through 203-8.

(3) The error correction packet generating unit 111 generates the error correction packet 204-3 by performing XOR operation to the video RTP packets 203-9 through 203-12 by the same procedure. The unit of the generation is made operational row 404. In other words, the head packet information indicates the video RTP packet 203-9, and the correction target information indicates the range of the correction target packet is the video RTP packets 203-9 through 203-12.

(4) The error correction packet generating unit 111 generates the error correction packet 2044 by performing XOR operation to the video RTP packets 203-13 through 203-16 by the same procedure. The unit of the generation is made operational row 405. In other words, the head packet information indicates the video RTP packet 203-13, and the correction target information indicates the range of the correction target packet is the video RTP packets 203-13 through 203-16.

(5) The error correction packet generating unit 111 generates the error correction packet 204-5 by performing XOR operation to the video RTP packets 203-1, 203-5, 203-9, and 203-13 by the same procedure as the description in (1). The unit of the generation is made operational column 406. An operational column is a column that is composed of the video RTP packet and the error correction packet that is generated from thereof. The head packet information indicates the video RTP packet 203-1, and the correction target information indicates the range of the correction target packet is the video RTP packets 203-1, 203-5, 203-9, and 203-13.

(6) In the same manner, the error correction packet generating unit 111 generates the error correction packet 204-6 by performing XOR operation to the video RTP packets 203-2, 203-6, 203-10, and 203-14. The unit of the generation is made operational column 407. In other words, the head packet information indicates the video RTP packet 203-2, and the correction target information indicates the range of the correction target packet is the 25 video RTP packets 203-2, 203-6, 203-10, and 203-14.

(7) In the same manner, the error correction packet generating unit 111 generates the error correction packet 204-7 by performing XOR operation to the video RTP packets 203-3, 203-7, 203-11, and 203-15. The unit of the generation is made operational column 408. In other words, the head packet information indicates the video RTP packet 203-3, and the correction target information indicates the range of the correction target packet is the video RTP packets 203-3, 203-7, 203-11, and 203-15.

(8) In the same manner, the error correction packet generating unit 111 generates error correction packet 204-8 by performing XOR operation to the video RTP packets 203-4, 203-8, 203-12, and 203-16. The unit of the generation is made operational column 409. In other words, head packet information indicates video RTP packet 203-4, and correction target information indicates the correction target packet is the range of video RTP packets 203-4, 203-8, 203-12, and 203-16.

As seen above, the error correction packets 204-1 through 204-8 are generated from the video RTP packets 203-1 through 203-16.

In the operational row 402, by using the error correction packet 204-1, the receiving unit 108 can restore a packet when one packet is lacking among the video RTP packets 203-1 through 203-4. In particular, the XOR operation is performed to each bit by the procedure stated in above (1), to the four packets which remain among the error correction packet 204-1 and the video RTP packets 203-1 through 203-4. Then, the result of the XOR operation of the four packets equals the lacked packet. In the same manner, in the operational column 406, by using the error correction packet 204-5, the active receiving unit 108 can restore a packet when one packet lacks among the video RTP packets 203-1, 203-5, 203-9, and 203-13. Further, by confirming the sequence number of a packet in the active receiving unit 108, it is possible to detect the lacking of a packet and to specify the packet.

Furthermore, in case of two or more packet losses in one operational row/operational column in processing, as long as there are at least one operational row or at least one operational column that has one or less packet loss, by focusing on the operational row or the operational column thereof, receiving unit 108 can restore a plurality of packets by repeating the restoration of a packet.

Because the restoration procedure of a packet when such packet loss occurs is generally known, the detailed description will be omitted.

According to the second embodiment, the synchronization process is performed between the active transmitting unit 103 and the standby transmitting unit 104 making correction block 401 as a unit.

Figure 6:
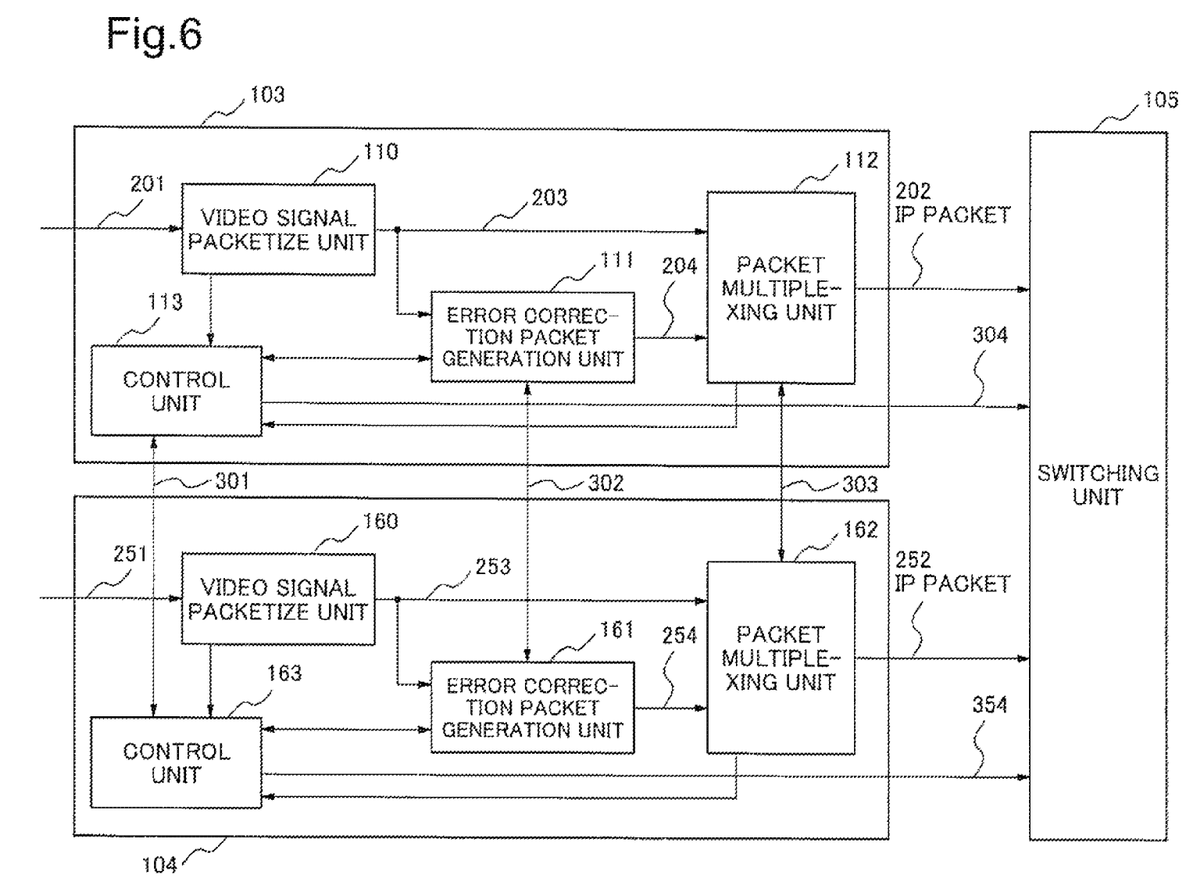
FIG. 6 is an explanatory diagram showing an error correction process by a correction block unit and a synchronization process of the generation of the error correction packet in the second embodiment of the transmission apparatus of the present invention.

FIG. 6 is a diagram that explains the error correction process in the correction block unit, and the synchronization process of generation of the error correction packet in the second embodiment of the present invention. The error correction process in the correction block unit and the synchronization process of the generation of the error correction packet in the active transmitting unit 103 will be described below. In addition, since the standby transmitting unit 104 has the same configuration as the active transmitting unit 103, the description will be omitted. In the following description on the active transmitting unit 103, a transmission function and a control function from the active transmitting unit 103 to the standby transmitting unit 104 are also included in the standby unit 104 as a transmission function and a control function from the standby transmitting unit 104 to the active transmitting 103.

The operation of the active transmitting unit 103 and the standby transmitting unit 104 in the second embodiment will be described in the following [1] through [5].

[1] The active transmitting unit 103 packetizes an inputted video 201 at a video packetize unit 110. In this case, the video signal packetize unit 110 outputs necessary information of packetizing in a video signal packetize unit 160 as a video signal packetize synchronization signal 301 to the video signal packetize unit 160. The video signal packetize synchronization signal 301 includes the information on the timing of the packetizing and information on the syntax of the video signal, and the information on individually designating outputting packet (hereinafter, referred to as individual information). As an example of individual information, there are a packet number or a sequence number. However, as long as individual information is the information that can identify a packet uniquely, the individual information may be the information besides the packet number and the sequence number. The standby transmitting unit 104 synchronizes the timing of the packetizing or the syntax of the standby transmitting 104 with the active transmitting unit 103, based on the video signal packetize synchronization signal 301.

As described above, the video signal packetize units 110 and 160 generate the video RTP packets 203 and 253 at the same timing. In other words, by following the procedure explained in FIG. 4, the video signal packetize units 110 and 160 generates synchronized video RTP packet 203.

By the procedure mentioned above, the synchronization can be performed between the active transmitting unit 103 and the standby transmitting unit 104 on the generation of video RTP packets 203 and 253. As a result, the same video RTP packets 203 and 253 can be inputted to an error correction packet generation units 111 and 161 at the same timing.

[2] The video signal packetize unit 110 transmits the video RTP packet 203 to the error correction packet generation unit 111. The error correction packet generation unit 111 starts the generation of correction block 401 when receiving the video RTP packet 203.

At this point, the error correction packet generation unit 111 regards the video RTP packet 203-1 as the head of the correction block and as belonging to the operational row 402 and operational column 406. Then, the error correction packet generation unit 111 holds the timing of the video RTP packet 203-1 and the packet number of the video RTP packet 203-1 as the correction block head timing information and the correction block head packet number of correction block 401. The timing of the video RTP packet 203-1 may be determined by the position of the head bit of the video RTP packet 203-1. Alternatively, the timing may be specified as the position of other bits in the video RTP packet 203-1.

Furthermore, the error correction packet generation unit 111 notifies an error correction packet generation unit 161 of the correction block head timing information and the individual information of the correction block packet number and the generated error correction packet.

The error correction packet generation unit 161 generates the error correction packet that synchronizes with the correction block head timing generated by error correction packet generation unit 111, by using the correction block head timing information.

At this point, when the position of the head bit of the video RTP packet 203-1 is regarded as the head timing of the correction block, the head timing of the correction block corresponds to the timing of the head bit of the video RTP packet 203-1.

Then, the error correction packet generation unit 161 generates the error correction packet of each operational row and each operational column of the video RTP packet starting from the correction block head packet number.

In the standby transmitting unit 104, by the setting of the generation process of the correction block, for example, the configuration of correction block 401 shown in FIG. 5, the same as the active transmitting unit 103, the process order of each operational row and each operational column shown in FIG. 5 can be made the same. The configuration of the correction block may be set in advance as a defined value of the system to the active transmitting unit 103 and the standby transmitting unit 104. Alternatively, by using the error correction process synchronization signal 302, the configuration of the correction block may be notified to the active transmitting unit 103 and the standby transmitting unit 104.

As in the descriptions above, in the second embodiment, the standby transmitting unit 104 synchronizes the timing of the packetizing of the video signal packetizing unit 160 and the syntax of tile video signal packetizing unit 1 10, based on the video signal packetize synchronization signal 301. Then, by transmitting the correction block timing information and the correction block head packet number to the error correction packet generation unit 161 from the error correction packet generation unit 111, it is possible to synchronize the error correction packet generation between the error correction packet generation units 111 and 161.

As a result, the active transmitting unit 103 and the standby transmitting unit 104 can generate the correction block which has the same packet as the head at the same timing.

As in the descriptions above, even in the second embodiment, when generating the error correction packet to the video RTP packet, it is possible to have the generation of the error correction packet be synchronized between active transmitting unit 103 and standby transmitting unit 104.

By the procedure of [1] and [2] stated above, the video RTP packets 203 and the error correction packets 204, that are synchronously generated, are transmitted to a packet multiplexing unit 112.

[3] The packet multiplexing unit 112 notifies a packet multiplexing unit 162 of the individual information of a packet transmitted to a switching unit by using a packet multiplexing synchronization signal 303.

The packet multiplexing unit 162 is notified of the individual information of a packet that the packet multiplexing unit 112 is sending, by packet multiplexing synchronization signal 303. Then, when multiplexing an RTP packet 253 and an error correction packet 254, the packet multiplexing unit 162 transmits a packet that has the same individual information as a packet of the multiplexing unit 112 is transmitting, to a switching unit 105 at the same timing of packet multiplexing unit 112. As a result, the same IP packets 202 and 252 arrive at the same timing to the switching unit 105 from the active transmitting unit 103 and the standby transmitting unit 104.

The packet multiplexing unit 162 compares the individual information of IP packet 252 which packet multiplexing unit 162 attempts to output, and the individual information of IP packet 202.

As the result of comparing the individual information of the IP packets 252 and 202, when the individual information between the IP packets 252 and 202 do not match, the packet multiplexing unit 162 notifies a control unit 163 of the result that the individual information do not match.

[4] From the video signal packetizing unit 110, by using the video signal packetize synchronization signal 301, the individual information of the video RTP packet 203 is transmitted to the video signal packetize unit 160. Further, from the error correction packet generation unit 111, by using the error correction process synchronization signal 302, the individual information of the error correction packet 204 is transmitted to the error correction packet generation unit 161.

The video signal packetize unit 160 compares the individual information of the video RTP packet 253 that is attempted to be outputted, with the individual information of the video RTP packet 203 received from the video signal packetize unit 10. When the individual information do not match between the video RTP packets 203 and 253, the video signal packetize unit 160 notifies control unit 163 of the fact that the individual information do not match.

The error correction packet generation unit 161 compares the individual information of the error correction packet 254 which is attempted to be outputted, with the individual information of the error correction packet 204 received from error correction packet generation unit 111. When the individual information between the error correction packets 204 and 254 do not match, the error correction packet generation unit 161 notifies the control unit 163 the fact that the individual information do not match.

[5] By using a synchronization status notification signal 354, the control unit 163 which have received the notice of not matching of the individual information from the video signal packetize unit 160, the error correction packet generation unit 161 or the packet multiplexing unit 162, notifies switching unit 105 of the abnormality in the synchronization of the active transmitting unit 103 and the standby transmitting unit 104.

By receiving the notice of the abnormality of the synchronization of the active transmitting unit 103 and the standby transmitting unit 104, the switching unit 105 prohibits switching to the standby transmitting unit 104.

By implementing such function, it is possible to prevent switching the unit from the active transmitting unit 103 to the standby transmitting unit 104 in the state of the generation of the correction block be not synchronized between the active transmitting unit 103 and the standby transmitting unit 104. In the result, it is possible to prevent switching unit 105 to transmit the correction block that the continuity is lost thereof.

As seen above, [1] through [5] are the descriptions of the operation of the second embodiment.

As the modification example of each procedure of the second embodiment, there is a configuration described below. More specifically, in the above stated [5], the notification to switching unit 105 from the standby transmitting unit 104, the video signal packetize unit 160 or the error correction packet generation unit 161 may perform directly without going through the control unit 163. Further, the control of switching unit 105 may use the system switching signal as described in the first embodiment.

As a further modification example, a procedure to stop the synchronization process when the video signal packetize unit 110 or the error correction packet generation unit 111 is at failure will be described below.

The video signal packetize unit 110 notifies the video signal packetize unit 160 of the own failure state by thereof using the video signal packetize synchronization signal 301. Further, the error correction packet generation unit 111 notifies the error correction packet generation unit 161 of the own failure state thereof by using error correction process synchronization signal 302. Then, when receiving the failure information from the video signal packetize unit 110 or the error correction packet generating unit 111, the video signal packetize unit 160 and the error correction packet generation unit 161 stops the synchronization process corresponding to each unit in the active transmitting unit 103.

When the video signal packetize unit 110 or the error correction packet generation unit 111 is at failure, the standby transmitting unit 104 packetizes inputted video signal 201 to the video RTP packet 203 without the synchronization process with the active transmitting unit 103. Then, the standby transmitting unit 104 multiplexes the video RTP packet 253 at packet multiplexing unit 162 with adding the error correction packet, and transmits the IP packet 252 to the switching unit.

Above are the descriptions of the modification examples of the second embodiment.

Further, because the configurations of the active transmitting unit 103 and the standby transmitting unit 104 are the same, the operation after the switching from the active unit to the standby unit is described as the configuration that replaces the active transmitting unit 103 and the standby transmitting unit 104 each other in the above description. For example, when receiving a notice of not matching of tile individual information from the video signal packetize unit I 10, the error correction packet generation unit 111 or the packet multiplexing unit 112, the control unit 113 notifies the switching unit 105 of the fact of abnormality of the synchronization between the active transmitting unit 103 and the standby transmitting unit 104, by a synchronization status notification signal 304.

Furthermore, the operation of the active transmitting unit 103 and the standby transmitting unit 104 in case of a restoration of the failure of the active system after the switching, the operation can be considered similarly as in the first embodiment. In other words, the switching to the active transmitting unit 103 from the standby transmitting 104 may be performed forcibly after a restoration of the active transmitting unit 103, taking the occurrence of a failure of the standby transmitting unit 104 as a trigger.

As described above, same as the first embodiment, the second embodiment of the present invention has the effect of preventing the receiving apparatus to perform a wrong correction.

This is because the individual information of the packet that the active transmitting unit 103 is transmitting is notified to the standby transmitting unit 104, and the synchronization state of the data of the active transmission unit and the standby transmitting unit is being confirmed. Further, when the active unit is at failure, the generating process of the correction block synchronized with the active unit in the standby unit is being stopped.

In addition, according to the second embodiment of the present invention, there is an effect of more certainly preventing the receiving apparatus from performing the wrong correction. This is because the individual information of packets that the video RTP packet, the error correction packet, and the individual information of a packet that the packet multiplexing unit transmits, are each compared at the time of the transmission in the active unit and in the standby unit. Further, it is because even when the comparison result does not match, die switching between the active unit and standby unit is prohibited.

3. Third Exemplary Embodiment

Figure 7:
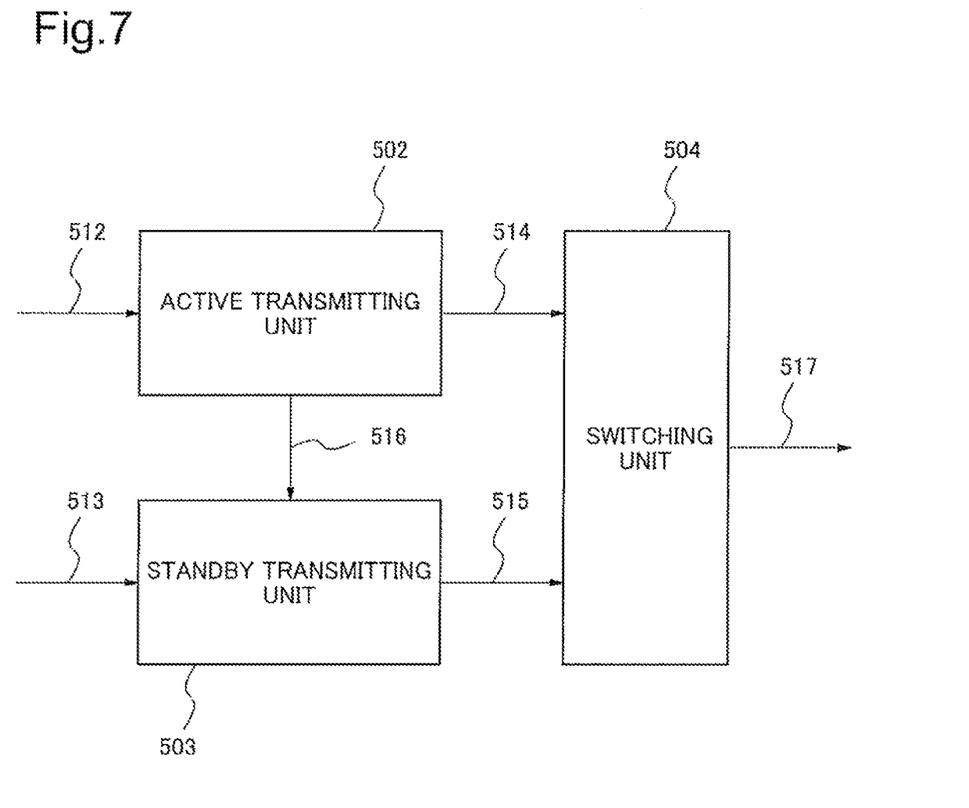
FIG. 7 is a diagram showing a third embodiment of a data transmission apparatus of the present invention.

FIG. 7 is a diagram showing a third embodiment of a data transmission apparatus of the present invention. In the third embodiment, the data transmission apparatus of the present invention is composed of an indispensable element. In a block diagram of FIG. 7, the data transmission apparatus of the present invention includes an active transmission unit 502, a standby transmitting unit 503 and a switching unit 504.

The active transmitting unit 502 and the standby transmitting unit 503 have the same configuration. The active transmitting unit 502 packetizes an input data 512, and generates error correction information from the packetized transmission data. Then, the active transmitting unit 502 multiplexes the packetized input data and error correction information generated from the packetized input data by the manner of time division multiplexing, and generates a correction block 514 and transmits the correction block 514 to switching unit 504.

At this point, the active transmitting unit 502 transmits the information to standby transmitting unit 503 as a correction block synchronization signal 516. The information is for synchronizing a generation of the error correction information between the active transmitting unit 502 and the standby transmitting unit 503.

The standby transmitting unit 503 packetizes an inputted input data 513 and generates the error correction information from the packetized input data. Then, the standby transmitting unit 503 multiplexes the packetized input data and the error correction information generated from the packetized input data by the manner of time division multiplexing, and generates a correction block 515 synchronized with correction block 514. The standby transmitting unit 503 transmits generated correction block 515 to switching unit 504.

The standby transmitting unit 503 confirms whether the error correction information is being generated from the same data at the same timing with the active transmitting unit 502 or not, by using the information for synchronizing the generation of the error correction information extracted from correction block synchronization signal 516. When an error correction coding process of the standby transmitting unit 503 does not synchronize with that of the active transmitting unit 502, in other words when the error correction information is not being generated from the same data at the same timing, the standby transmitting unit 503 prohibits the switching of switching unit 504.

The switching unit 504 receives the correction blocks 514 and 515 from the active transmitting unit 502 and the standby transmitting unit 503. The switching unit 504 normally selects and outputs the correction block 514 as a transmission data 517.

At this point, when the standby transmitting unit 503 does not prohibit the switching, if the active transmitting unit 502 becomes failure state, the switching unit 504 transmits the correction block 515 as transmission data 517.

On the other hand, when the switching is prohibited by the standby transmitting unit 503, the switching unit 504 does not perform the switching regardless of the state of the active transmitting unit 502.

More specifically, the data transmission apparatus having the configuration shown in FIG. 7 prohibits the switching when the error correction coding process of the active transmitting unit 502 does not synchronize with that of the standby transmitting unit 503.

Therefore, the data transmission apparatus described in FIG. 7 also resolves the problem of having the possibility of the performance of the wrong correction of the receiving apparatus, if the switching is performed in the case of the error correction coding process is not synchronizing.

4. Fourth Exemplary Embodiment

Figure 8:
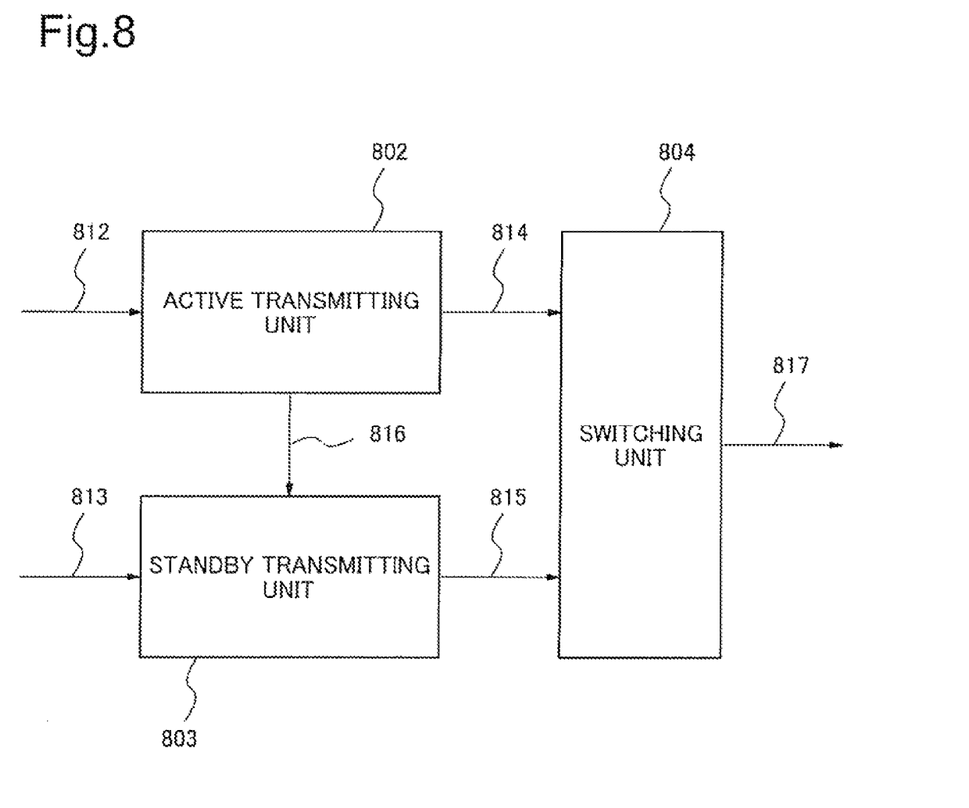
FIG. 8 is a diagram showing a fourth embodiment of a data transmission apparatus of the present invention.

FIG. 8 shows a diagram of a data transmission apparatus in a fourth embodiment of the present invention. Referring to the block diagram of FIG. 8, the data transmission apparatus of the present invention includes an active transmitting unit 802, a standby transmitting unit 803 and a switching unit 804.

The active transmitting unit 802 and the standby transmitting unit 803 have the same configuration. The active transmitting unit 802 generates a first error correction information from a first data inputted from line 812. Then, the active transmitting unit 802 transmits the first data and the error correction information generated from the first data to switching unit 804 via a line 814.

At this point, the active transmitting unit 802 transmits a first specified information for the synchronization of the generation of the error correction information with the standby transmitting unit 803. The first specified information includes timing information of the first data and the information of specifying the first data.

The standby transmitting unit 803 generates a second error correction information from the second data inputted from line 813. Then, the standby transmitting unit 803 transmits the second data and the second error correction information to switching unit 804 via a line 815.

The standby transmitting unit 803 extracts the timing information of the first data and the information specifying the first data, from the first specified information received from a line 816.

Then, the standby transmitting unit 803 compares the information that specifies the first data and the information that specifies the second data, at the timing indicated by the timing information of the first data. In other words, the standby transmitting unit 803 confirms whether the error correction coding process in the standby transmitting unit synchronizes or not with the active transmitting unit 802 at the same timing. When the error correction coding process of the active transmitting unit 802 does not synchronize with that of the standby transmitting unit 803, in other words when the error correction information is not generated from the same data at the same timing, the standby transmitting unit 803 prohibits the switching between the active transmitting unit 802 and the standby transmitting unit 803 by switching unit 804.

The switching unit 804 receives the first data and the first error correction information, and, the second data and the second error correction information via lines 814, 815 respectively, from the active transmitting unit 802 and the standby transmitting unit 803. The switching unit 804 normally outputs the first data and the first error correction information received from the active transmitting unit 802, as the transmission data to a line 817.

At this point, when the standby transmitting unit 803 does not prohibit the switching, if the active transmitting unit 802 becomes in a failure state, the switching unit 804 transmits the second data and the second error correction information received from the standby transmitting unit 803, as transmission data to line 817.

On the other hand, when the standby transmitting unit 803 prohibits the switching, the first data and the first error correction information received from the standby transmitting unit 802 are outputted as the transmission data to line 817, regardless of the state of the active transmitting unit 802.

More specifically, the transmission apparatus having the configuration shown in FIG. 8 will not perform the switching between the active transmitting unit 802 and the standby transmitting unit 803, when the error correction coding process does not synchronize.

Therefore, the data transmission apparatus of the fourth embodiment also resolves the problem of having the possibility of the performance of the wrong correction of the receiving apparatus, when the switching is performed in the case of the error correction coding process being not synchronized.

An exemplary advantage according to the invention is to prevent the occurrence of an abnormality of the error correction process of the data receiving apparatus, when the switching is performed to the standby system from the active system.

This is because in a data transmission apparatus, the synchronized state of the data and the error correction information transmitted from the error correction coding process and the data transmission apparatus, between the active transmitting unit and the standby transmitting unit, is being confirmed.

According to the background art, the data transmission apparatus equipped with the redundant configuration may be further equipped with a function of performing error correction coding process. In this case, when the error correction coding process between the active system and the standby system of the data transmission apparatus does not synchronize, a problem of not being able to perform normally the error correction processing of receiving apparatus may occur when switching to the standby system from the active system.

The reason will be described below. The data transmission apparatus equipped with an error correction coding process function generates error correction information for plural units of the transmission data (for example, the unit means packets). Then, error correction information is added to data of which composes an output unit thereof. The overall data including the data composing an output unit and the added error correction information is called a unit block of an error correction coding process (hereinafter, referred to as correction block). When the generation of the outputting correction block synchronizes between the active system and the standby system, the correction block will not be discontinuous when switching transmission output between the active system and the standby system.

The state of generation timing and contents of the correction block in the active system and the standby system is matching, that is, the state that the correction block generated at the same time includes the same data and the error correction code, is called the state that the generation in the correction block synchronizes. In this state, even if the switching occurs in the middle of the correction block, the continuity of the correction block is not lost after the switching.

If the transmission apparatus performs the switching from the active system to the standby system when the generation of the correction block is not in the state of synchronization, continuity of a packet included in the correction block received by the receiving apparatus is lost before and after the switching. As a result, the receiving apparatus receives an improper correction block after the switching. When the receiving apparatus receives an improper correction block, the receiving apparatus may perform a wrong correction and there is a possibility of the processing to stop due to the abnormality of the received data.

Although the art described in Japanese Patent Laid-Open No. H08-008886 discloses a configuration of performing frame synchronization between the active system and the standby system, the generation of a correction block included inside the frame is not synchronized. In other words, in the configuration described in Japanese Patent Laid-Open No. H08-008886, the generation in a correction block included inside the frame cannot be synchronized. Accordingly, in the configuration described in Japanese Patent Laid-Open No. H08-008886, there is a possibility of an occurrence of a serious failure in the receiving apparatus when the transmission apparatus performs the system switching in a state of the generation of a correction block not being synchronized.

Furthermore, the art described in Japanese Patent Laid-Open No. 2002-290314 and the art described in Japanese Patent Laid-Open No. H10-224430 do not synchronize generation of a correction block included inside a frame either. Therefore, both the radio base station unit disclosed in Japanese Patent Laid-Open No. 2002-290314 and the switching system disclosed in Japanese Patent Laid-Open No. H10-224430 cannot perform normally the error correction process of a receiving apparatus when the switching from an active system to a standby system is performed.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A data transmission apparatus comprising:
a first transmitting unit, a second transmitting unit, and a switching unit,
wherein the first transmitting unit generates a first error correction information based on a first data, outputs the first data and the first error correction information to the switching unit and transmits a timing information of the first data and a first specified information to specify the first data to the second transmitting unit,
wherein the second transmitting unit generates a second error correction information based on a second data, outputs the second data and the second error correction information to the switching unit, compares a second specified information to specify the second data and the first specified information at the timing of the timing information of the first data indicates and transmits the comparison result of the second specified information and the first specified information to the switching unit,
wherein the switching unit selects and transmits the inputted first data and the inputted first error correction information, when the first comparison result is not indicating a match of the second specified information and the first specified information, so that switching from the first transmitting unit to the second transmitting unit is not performed unless the first specified information matches the second specified information,
wherein the first transmitting unit further generates the first error correction information based on a timing information of the first data, outputs a first correction block generated by multiplexing the first data and the first error correction information to the switching unit and transmits a failure status when a failure occurs in the first transmitting unit to the second transmitting unit and the switching unit,
wherein the second transmitting unit further generates a second error correction information based on the timing information of the first data, when not receiving the failure information from the first transmitting unit and outputs a second correction block generated by multiplexing the second data and the second error correction information, to the switching unit, and
wherein the switching unit further selects and transmits the inputted first correction block, when not receiving the failure information from the first transmitting unit.

2. The data transmission apparatus according to claim 1,
wherein the first transmitting unit transmits a transmission timing information and a transmission order information included in a data of the first correction block, together with a third specified information specifying a packet included in the first correction block, to the second transmitting unit,
wherein the second transmitting unit outputs the second correction block based on the transmission order information to the switching unit, compares a fourth specified information specifying a data included in the second correction block with the third specified information at the timing of the transmission timing information indicates and transmitting the second comparison result which is the result of the comparison to the fourth specified information with the third specified information to the switching unit, and
wherein the switching unit selects and transmits the inputted first correction block when the second comparison result is not indicating a match of the fourth specified information and the third specified information.

3. The data transmission apparatus according to claim 1, wherein when the second transmitting unit or the switching unit receives the failure information from the first transmitting unit, the second transmitting unit generates the second error correction information without basing on the timing information of the first data and further the switching unit selects and transmits the second correction block.

4. A data transmission method, comprising the steps of:
generating a first error correction information based on a first data;
outputting the first data and the first error correction information to a switching unit;
transmitting a timing information of the first data and a first specified information to specify the first data to the second transmitting unit;
generating a second error correction information based on a second data;
outputting the second data and the second error correction information to the switching unit;
comparing a second specified information to specify the second data and the first specified information at the timing of the timing information of the first data indicates;
transmitting the first comparison result of the second specified information and the first specified information to the switching unit;
selecting and transmitting the inputted first data and the inputted first error correction information, when the first comparison result is not indicating a match of the second specified information and the first specified information, so that switching from the first transmitting unit to the second transmitting unit is not performed unless the first specified information matches the second specified information;

outputting a first correction block generated by multiplexing the first data and the first error correction information, to the switching unit;

transmitting a failure status when a failure occurs in the first transmitting unit, to the second transmitting unit and the switching unit;

generating a second error correction information based on the timing information of the first data, when not receiving the failure information from the first transmitting unit;

outputting a second correction block generated by multiplexing the second data and the second error correction information, to the switching unit; and selecting and transmitting the inputted first correction block, when not receiving the failure information from the first transmitting unit.

5. The data transmission apparatus according to claim 4, further comprising the steps of:

transmitting a transmission timing information and a transmission order information included in a data of the first correction block, together with a third specified information specifying a packet included in the first correction block, to the second transmitting unit;

outputting the second correction block to the switching unit based on the transmission order information;

comparing a fourth specified information specifying a data included in the second correction block with the third specified information, at the timing of the transmission timing information indicates;

transmitting the second comparison result which is the result of the comparison between the fourth specified information and the third specified information to the switching unit; and when the second comparison result is not indicating a matching of the fourth specified information and the third specified information, selecting and transmitting the inputted first correction block.

6. The data transmission method according to claim 4, further comprising the steps of:

generating the second error correction information without basing on the timing information of the first data when receiving the failure information from the first transmitting unit, further, selecting and transmitting the second correction block.

* * * * *